United States Patent
Katz et al.

[11] Patent Number: 5,936,259
[45] Date of Patent: Aug. 10, 1999

[54] THIN FILM TRANSISTOR AND ORGANIC SEMICONDUCTOR MATERIAL THEREOF

[75] Inventors: Howard Edan Katz, Summit, N.J.; Joyce G. Laquindanum, Hatfield, Pa.

[73] Assignee: Lucent Technologies Inc., Murray Hill, N.J.

[21] Appl. No.: 08/951,779

[22] Filed: Oct. 16, 1997

[51] Int. Cl.$^6$ .............................. H01L 51/30; H01L 51/40
[52] U.S. Cl. .............................. 257/40; 438/99; 438/151; 257/288
[58] Field of Search ....................... 257/40, 288; 438/99, 438/151

[56] References Cited

U.S. PATENT DOCUMENTS

| | | | |
|---|---|---|---|
| 5,574,291 | 11/1996 | Dodabalapur et al. | 247/40 |
| 5,596,208 | 1/1997 | Dodabalapur et al. | 257/66 |
| 5,612,228 | 3/1997 | Shieh et al. | 437/1 |
| 5,625,199 | 4/1997 | Baumbach et al. | 257/40 |
| 5,854,139 | 12/1998 | Aratani et al. | 438/780 |

OTHER PUBLICATIONS

Patent No. HEI 8'1996'–18125, AA: "Novel π–Extended Thiphene–Fused Electron Acceptors for Organic Metals," by de la Cruz, P. et al., *J. Org. Chem.* 57, p. 6192.

"Logic Gates Made From Polymer Transistors and Their Use in Ring Oscillators", by Brown, A. R. et al., *Science*, vol. 270, pp. 972–974 (Nov. 10, 1995).

"Semiconductor Devices", by Sze, S. M., *John Wiley & Sons*, pp. 200–207.

"Morphological Origin of High Mobility in Pentacene Thin–Film Transistors", by Laquindanum, J. et al., *Chemistry of Materials*, vol. 8, No. 11, pp. 2542–2544 (1996).

"Organic Field–Effect Transistors with High Mobility Based on Copper Phthalocyanine", by Boa, Z. et al., *Appl. Phys. Lett.*, 69 (20), 11 pp. 3096–3068 (Nov. 11, 1966).

"Soluble and Processable Regioregular Poly(3–hexylthipene) for Thin Film Field–Effect Transistotr Applications with High Mobility", by Bao, Z. et al., *Appl. Phys. Lett.*, 69 (26), p. 4108 (Dec. 23, 1996).

"Structural Basis for High Carrier Mobility in Conjugated Oligomers", by Garnier, F. et al., *Workshop on the Materials Science of Conductive Polymers*, Vol. 45, p. 163 (1991).

"Benzodithiophene Rings as Semiconductor Building Blocks", by Laquindanum, J. et al., *Advanced Materials*, 9, No. 1, pp. 36–39 (1997).

*Primary Examiner*—John Guay
*Attorney, Agent, or Firm*—Richard J. Botos

[57] ABSTRACT

Thin film transistors in which the active layer is a film of an organic semiconductor with a structure having two or three six-membered, fused aromatic rings with two five-membered, heterocyclic aromatic rings fused thereto. The five-membered rings are either substituted or unsubstituted. If substituted, the substituents are either alkyl or alkoxyalkyl with about two to about 18 carbon atoms. The organic semiconductor compound has a field-effect mobility greater than $10^{-3}$ cm$^2$/Vs and a conductivity less than about $10^{-6}$ S/cm at 20° C. Thin film devices made of these materials have an on/off ratio of at least about 100.

10 Claims, 1 Drawing Sheet

THIN FILM TRANSISTOR AND ORGANIC SEMICONDUCTOR MATERIAL THEREOF

FIELD OF THE INVENTION

This invention is directed to thin film transistors (TFTs) that have an organic semiconductor layer.

BACKGROUND OF THE INVENTION

Thin film transistors (TFTs) with organic active layers and printed electronic components are emerging as an inexpensive alternative to silicon-based TFTs for some applications. The organic materials provide the ability to produce these devices without the expensive steps associated with silicon processing. Other advantages include the greater mechanical flexibility and easier tunability of organic-based devices relative to thin film transistors formed on silicon substrates. Although the performance of the organic-based devices will not match the performance of the silicon-based TFTs in terms of device density and reliability under extreme conditions (e.g. high or low temperatures), organic-based TFTs have application where device density and reliability under extreme conditions can be sacrificed in favor of economy.

A variety of organic materials have been proposed for use as the semiconductor material in the organic based TFTs. For example, a variety of p-channel (hole transporting) materials that are characterized as linear, conjugated molecules have been proposed as semiconductor materials for TFTs. Thiophene oligomers are proposed as organic semiconductor materials in Garnier, F., et al., "Structural basis for high carrier mobility in conjugated oligomers" *Synth. Met.*, Vol. 45, p. 163 (1991). Benzodithiophene dimers are proposed as organic semiconductor materials in Laquindanum, J., et al., "Benzodithiophene Rings as Semiconductor Building Blocks" *Adv. Mater.*, Vol. 9, p. 36 (1997). Pentacene is proposed as an organic semiconductor material in Laquindanum, J., et al., "Morphological Origin of High Mobility in Pentacene Thin-Film Transistors" *Chem. Mater.*, Vol. 8, p. 2542 (1996). Other organic semiconductor materials that have hole-transporting characteristics and have been proposed for use as organic semiconductors in TFTs include phthalocyanines described in Bao, Z., et al., "Organic field-effect transistors with high mobility based on copper phthalocyanine" *Appl. Phys. Lett.* Vol. 69, p. 3066 (1996) and poly(alkylthiophenes) described in Bao, Z., et al., "Soluble and processable regioregular poly(3-hexylthiophene) for thin film field-effect transistor applications with high mobility" *Appl. Phys. Lett.* Vol. 69, p. 4108 (1996). Although these materials exhibit hole mobilities which make them attractive as potential organic semiconductors for TFT devices, some improvement in the properties of these materials is required in order for TFT devices with organic semiconductors to be commercially feasible. An attractive material would have a high mobility (i.e. a mobility at least above 0.01 cm$^2$/V-s with a low, zero-field conductivity (i.e. <10$^{-6}$ S/cm). An attractive film would also be deposited from the liquid phase, have a thermal stability of at least 200° C., and have stability to oxidation and photo-oxidation.

For example, pentacene is reported to have a mobility of about 1 cm$^2$/V-s. However pentacene films are difficult to form from solution because pentacene is extremely insoluble in organic solvents. Pentacene also tends to oxidize over time in an oxygen-containing atmosphere and thus exhibits what is referred to as oxidative instability.

Accordingly, although numerous materials have been proposed for use as the organic semiconductor for TFTs, organic semiconductor materials that exhibit all of the above characteristics are desired.

SUMMARY OF THE INVENTION

The present invention is directed to a TFT in which the semiconductor material is a fused ring organic material that has either the following general structure:

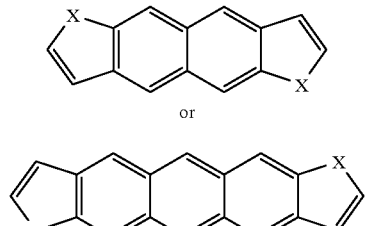

or wherein X is either oxygen (O), amine (NH or NCH$_3$), or sulfur (S) or the syn isomeric form of the structures (the above structures being the anti isomeric form). The material is either substituted or unsubstituted. If substituted, suitable substituents include, by way of example, alkyl and alkoxyalkyl substituents with about 2 to about 18 carbon atoms. It is advantageous if the alkyl and alkoxyalkyl substituents have about 4 to about 12 carbon atoms. If substituted, the substituent is advantageously on the tertiary carbon atom adjacent to the heteroatom (X) of the five-membered terminal rings.

The organic semiconductor is soluble in polarizable organic solvents such as chlorobenzene and xylene when the concentration of the organic semiconductor in the solvent is about 0.01 to about 1 percent and the temperature of the solvent is above about 70° C. It is advantageous if the polarizable organic solvent is an aromatic, polarizable organic solvent. In one embodiment of the present invention, films of the organic semiconductor material are formed from these solutions by conventional casting techniques. Films of the organic semiconductor material are also formed using other conventional techniques such as sublimation. In the embodiment of the present invention wherein the organic semiconductor film is formed from solution, it is advantageous if the organic semiconductor is substituted in the above-described manner to enhance its solubility in the organic solvent. The organic semiconductor material has a melting point greater than 250° C. and does not significantly oxidize in air over time in either its solid form or in solution.

The organic TFT of the present invention has an organic semiconductor material layer in which the organic material has the above-identified chemical structure. The device has a first contact and a second contact which are spaced apart from each other but are both in contact with the organic semiconductor layer. The device also has a third contact which is spaced apart from the first and second contacts. By applying a voltage to the third contact, the flow of current through the organic semiconductor between the first and second contacts is controlled.

The organic semiconductor layer has an electrical conductivity of less than about 10$^{-6}$ S/cm at temperatures of about 20° or less. The higher the purity of the organic semiconductor, the lower its conductivity. The organic semiconductor layer also has a field effect mobility greater than 0.01 cm$^2$/V-s. The thickness of the organic semiconductor layer is selected so that a uniform film without gaps is obtained. Typically the film thickness is about 50 nm, but films as thin as 5 nm are contemplated as suitable provided that the films are continuous.

The TFT device of the present invention is formed on a conventional substrate material such as glass, silicon or plastic. A layer of dielectric material is formed over the substrate. One of the contacts is physically connected to the substrate and the layer of dielectric material is interposed between the other two contacts and the substrate.

DETAILED DESCRIPTION

The present invention is directed to a TFT device with an organic semiconductor layer. In the devices of the present invention, the organic semiconductor layer (also referred to as the active layer) is a fused ring organic compound with two or three fused six-membered aromatic rings that are end capped with five-membered aromatic heterocyclic rings. The organic compound is typically a mixture of the syn and anti isomers. The compound in its anti isomeric configuration is illustrated generally as:

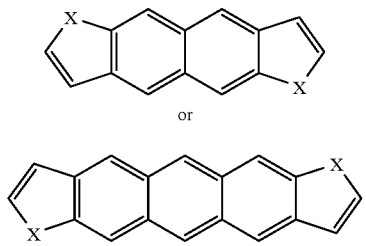

wherein X is either oxygen (O), amine (NH or NCH$_3$), or sulfur (S).

Figure 1A:
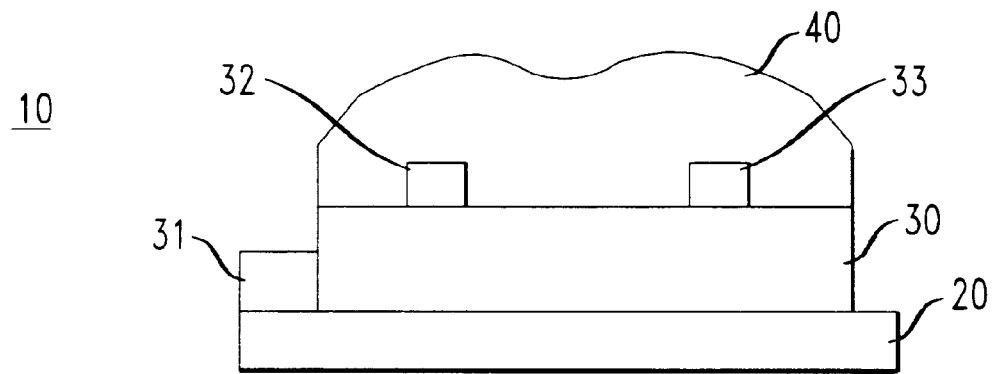
FIGS. 1a and 1b are cut away schematic side views of conventional TFT devices.
Figure 1B:
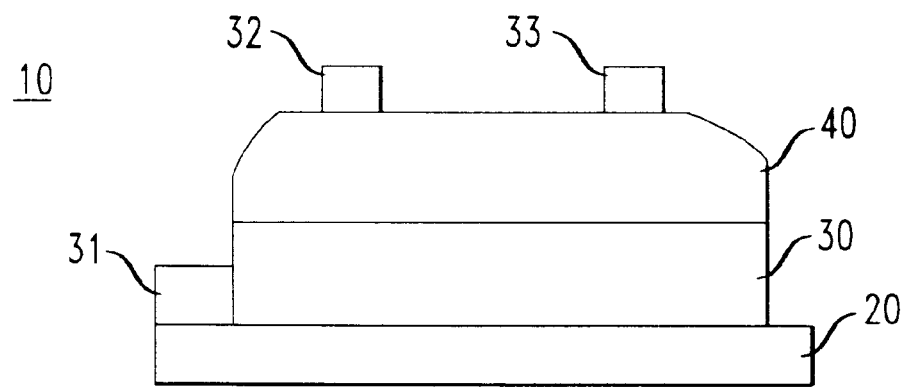

Thin film transistors have the general structures depicted in FIGS. 1a and 1b. These devices 10 are formed on a substrate 20 which is typically glass, silicon, or plastic. If a very inexpensive or flexible device is desired, a plastic substrate is generally used. A layer of dielectric material 30 is formed on the substrate 20. Suitable dielectric materials are well known to one skilled in the art. Examples of dielectric materials include silicon dioxide, silicon nitride (Si$_3$N$_4$), polyimide, or aluminum oxide (Al$_2$O$_3$).

The device 10 has three spaced-apart contacts 31, 32, and 33. At least one of the contacts (31, 32, and 33 in FIG. 1a and 31 in FIG. 1b) is in contact with the dielectric layer 30. The contacts 31, 32, and 33 and the dielectric layer 30 are formed on the substrate using well known, conventional techniques which are not discussed in detail herein.

A layer of the organic semiconductor material 40 is formed over the layer of dielectric material 30. In the structure depicted in FIG. 1a, two of the spaced apart contacts (32 and 33) are formed directly on the dielectric layer 30. In the structure depicted in FIG. 1b, two of the spaced apart contacts (32 and 33) are formed on the organic semiconductor layer 40. In both structures the organic semiconductor 40 is interposed between two spaced apart contacts (32 and 33). As with other organic semiconductor materials, the transconductance of the organic semiconductor material of the present invention is virtually independent of film thickness. This is because the induced charge resides in the first one or two monolayers of the film. Therefore, the thickness of the film is selected to provide a uniform film (i.e. a film without gaps or holes that adversely affect the transport properties of the material). The thickness of the organic semiconductor layer is in the range of about 150 nm to about 5 nm. Thicknesses in the range of about 50 nm to about 5 nm are contemplated as suitable.

The device of the present invention has an on/off ratio greater than $10^2$ at 20° C. "Off" as used herein is zero gate voltage. In order to obtain devices with the desired on/off ratio, it is advantageous if the organic semiconductor has a field effect mobility greater than $10^{-2}$ cm$^2$/V-s and a conductivity less than about $10^{-6}$ S/cm.

EXAMPLE 1

A compound that was a mixture of the syn and anti isomers of anthradithiophene-5,11-dione, i.e., anthra[2,3-b:6-7-b']dithiophene-5,11-dione and anthra[2,3-b:7-6-b'] dithiophene-5,11 dione was prepared by following the process described in De la Cruz, et al., "Novel π, -Extended Thiophene-Fused Electron Acceptors for Organic Metals" *J. Org. Chem.* Vol. 57, p. 6192 (1992), which is hereby incorporated by reference.

Aluminum wire (1 g) was reacted in dry cyclohexanol (30 ml) that contained mercuric chloride (0.02 g) and carbon tetrachloride (0.2 ml) by warming the mixture slowly to mild reflux (which was controlled by cooling). (Unless otherwise indicated herein, all of the starting materials described in these examples were obtained from the Aldrich Chemical Co. of Milwaukee, Wis.) The above-described dione compound (1 g; 3 mmol) was added and the resulting mixture was refluxed under nitrogen for 48 hours. The reaction mixture was then cooled to 50° C. and centrifuged to collect the solids. The solids were washed twice with warm cyclohexanol followed by twice with glacial acetic acid, twice with aqueous HCl (10%), and twice with ethanol. The resulting product was a mixture of the syn and anti isomers of anthradithiophene.

In one embodiment of the present invention, the organic semiconductor material has substituent groups on the five membered rings. Examples of suitable substituents include alkyl substituents and alkoxyalkyl substituents having about 2 to about 18 carbon atoms. It is advantageous if the number of carbon atoms in these substituents is about 4 to about 12 carbon atoms. The presence of the alkyl and alkoxyalkyl substituents enhances the solubility of the organic semiconductor in organic casting solvents. For example, unsubstituted anthradithiophene is soluble at about 0.01 to about 0.1 weight percent chlorbenzene. Substituted anthradithiophene is soluble at about 0.1 to about 1 weight percent in a suitable organic solvent. Enhanced solubility of these materials is important because the process latitude for casting films is greater. Greater process latitude is provided by a wider choice of suitable solvents, a wider temperature range for solution preparation, and a wider range of temperatures and pressures at which to evaporate the solvent. Because of the greater process latitude, it is more likely that a sufficiently pure and well-ordered film is obtained. A pure, well-ordered film is more likely to have desirable electrical characteristics than a less pure, less ordered film.

One example of a substituted organic semiconductor material of the present invention is substituted anthradithiophene. An example of the structure of substituted anthradithiophene is:

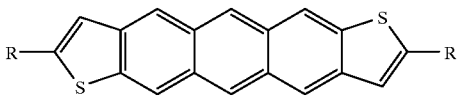

wherein R is an alkyl or an alkoxyalkyl substituent as described above. As previously noted, the compound is typically a mixture of its syn and anti isomers. A method for synthesizing substituted anthradithiophenes is described in the following example 2.

EXAMPLE 2

2,3 Thiophene dicarboxaldehyde (2 g, 14 mmol), p-toluenesulfonic acid monohydrate (2 mg), and ethylene glycol (1.96 g, 30 mmol) were added to dry benzene (25 ml). The mixture was refluxed and water was collected in a Dean-Stark trap. The mixture was then cooled and washed with aqueous NaOH (10%) followed by water. The mixture was then dried over $MgSO_4$. The resulting product was 2,3-bis(1,3-dioxolan-2-yl)thiophene. This compound was used to synthesize three different alkyl-substituted anthradithiophenes: 2,8-dihexylanthradithiophene, 2,8-didodecylanthradithiophene, and 2,8-dioctadecylanthradithiophene.

a. Synthesis of 2,8-dihexylanthradithiophene 2,3-Bis(1,3-dioxolan-2-yl)thiophene (3 g, 10.3 mmol) was dissolved in dry tetrahydrofuran (THF) (50 ml) under a nitrogen atmosphere and cooled to −78° C. n-Butyllithium (6.8 ml, 2.5M in hexane) was added dropwise. After five minutes, 1-iodohexane (2.5 ml, 17 mmol) was added to the solution. The solution was stirred at −78° C. and was left to warm to room temperature overnight. Water was added and the organic layer was washed several times with water. The organic extract was dried over $MgSO_4$ and concentrated. The crude product was purified using column chromatography using silica gel (1:2 ethyl acetate:hexane).

The product was then dissolved in THF (50 ml) and a 3N solution of HCl and refluxed for at least 15 minutes. The solution was cooled to room temperature. Ice was added and the mixture was extracted with ether. The combined organic extract was washed with dilute sodium bicarbonate and dried over $MgSO_4$. The product was then used without purification to synthesize a mixture of syn and anti isomers of 2,8-dihexylanthradithiophene-5,11-dione using the synthesis described in De la Cruz, et al., *J. Org. Chem.* Vol. 57, p. 6192 (1992).

Aluminum wire (0.25 g) was reacted in dry cyclohexanol (25 ml) that contained mercuric chloride (0.0025 g) and carbon tetrachloride (0.2 ml) by warming the mixture slowly to mild reflux (which was controlled by cooling). The above-described dione compound (0.37 g; 0.7 mmol) was added and the resulting mixture was refluxed under nitrogen for 48 hours. The reaction mixture was then cooled to 50° C. and centrifuged to collect the solids. The solids were washed with warm cyclohexanol followed by glacial acetic acid, aqueous HCl (10%), and ethanol. The product was purified by vacuum sublimation at a pressure of about $10^{-4}$ torr.

b. Synthesis of 2,8-didodecylanthradithiophene 2,3-Bis(1,3-dioxolan-2-yl)thiophene (2 g, 9 mmol) was dissolved in dry tetrahydrofuran (THF) (50 ml) under a nitrogen atmosphere and cooled to −78° C. n-Butyllithium (4.2 ml, 2.5M in hexane) was added dropwise. After five minutes, 1-iodododecane (3.12 g, 10.5 mmol) was added to the solution. The solution was stirred at −78° C. and was left to warm to room temperature overnight. Water was added and the organic layer was washed several times with water. The organic extract was dried over $MgSO_4$ and concentrated. The crude product was purified using column chromatography using silica gel (1:2 ethyl acetate:hexane).

The product was then dissolved in THF (50 ml) and a 3N solution of HCl and refluxed for at least 15 minutes. The solution was cooled to room temperature. Ice was added and the mixture was extracted with ether. The combined organic extract was washed with dilute sodium bicarbonate and dried over $MgSO_4$. The product was then used without purification to synthesize a mixture of syn and anti isomers of 2,8-didodecylanthradithiophene-5,11-dione using the synthesis described in De la Cruz, et al., *J. Org. Chem.* Vol. 57, p. 6192 (1992).

Aluminum wire (0.4 g) was reacted in dry cyclohexanol (25 ml) that contained mercuric chloride (0.001 g) and carbon tetrachloride (0.2 ml) by warming the mixture slowly to mild reflux (which was controlled by cooling). The above-described dione compound (0.9 g; 1.4 mmol) was added and the resulting mixture was refluxed under nitrogen for 48 hours. The reaction mixture was then cooled to 50° C. and centrifuged to collect the solids. The solids were washed with warm cyclohexanol followed by glacial acetic acid, aqueous HCl (10%), and ethanol. The product was purified by vacuum sublimation at a pressure of about $10^{-4}$ torr.

c. Synthesis of 2,8-dioctadecylanthradithiophene 2,3-Bis(1,3-dioxolan-2-yl)thiophene (2 g, 9 mmol) was dissolved in dry tetrahydrofuran (THF) (50 ml) under a nitrogen atmosphere and cooled to −78° C. n-Butyllithium (4.2 ml, 2.5M in hexane) was added dropwise. After five minutes, 1-iodooctadecane (3.84 g, 10 mmol) was added to the solution. The solution was stirred at −78° C. and was left to warm to room temperature overnight. Water was added and the organic layer was washed several times with water. The organic extract was dried over $MgSO_4$ and concentrated. The crude product was purified using column chromatography using silica gel (1:2 ethyl acetate:hexane).

The product was then dissolved in THF (50 ml) and a 3N solution of HCl and refluxed for at least 15 minutes. The solution was cooled to room temperature. Ice was added and the mixture was extracted with ether. The combined organic extract was washed with dilute sodium bicarbonate and dried over $MgSO_4$. The product was then used without purification to synthesize a mixture of syn and anti isomers of 2,8-dioctadecylanthradithiophene-5,11-dione using the synthesis described in De la Cruz, et al., *J. Org. Chem.* Vol. 57, p. 6192 (1992).

Aluminum wire (0.4 g) was reacted in dry cyclohexanol (25 ml) that contained mercuric chloride (0.001 g) and carbon tetrachloride (0.2 ml) by warming the mixture slowly to mild reflux (which was controlled by cooling). The above-described dione compound (0.86 g; 1 mmol) was added and the resulting mixture was refluxed under nitrogen for 48 hours. The reaction mixture was then cooled to 50° C. and centrifuged to collect the solids. The solids were washed with warm cyclohexanol followed by glacial acetic acid, aqueous HCl (10%), and ethanol. The product was purified by vacuum sublimation at a pressure of about $10^{-4}$ torr.

EXAMPLE 3

Thin film devices having the structures illustrated schematically in FIGS. 1A and 1B were fabricated using the organic semiconductor materials prepared according to the procedure described in Examples 1 and 2 above. Both device structures were fabricated by thermally growing a dielectric layer of silicon dioxide on an n-doped silicon substrate which acted as the gate. In fabricating the structure illustrated in FIG. 1a, the contact channel for contacts 32 and 33 were photolithographically defined on the silicon dioxide layer with a channel width of about 250 μm and channel lengths in the range of 1.5 μm to 25 μm. The contact metal is gold for the devices described in this example.

The organic semiconductor materials were sublimed onto the substrates at pressures in the range of less than about $3 \times 10^{-6}$ torr at a deposition rate of about 0.5 nm/s. (Contrary to the structures illustrated in FIGS. 1a and 1b, the organic semiconductor film was sublimed over contact 31. This did not adversely affect the performance of the device.) The temperature of the substrates was controlled during deposition by heating the copper block on which the substrates were placed.

The electrodes 32 and 33 in the structure illustrated in FIG. 2 were formed on top of the semiconductor material using a shadow mask. The contacts had widths of either 4 mm or 0.23 mm and lengths of 1 mm or 0.15 mm, respectively. The width to length ratios of the contacts are 4/1 and 1.5/1 respectively. The active area of the semiconductor film with contacts having a width to length ratio of 1.5/1 formed thereon was about 0.03 to about 0.04 mm². The active area of the semiconductor film with contacts having a width to length ratio of 4/1 formed thereon was about 4 mm².

The field effect mobilities for the unsubstituted anthradithiophene films was determined by applying a swept source drain voltage (0 to 100 volts) to devices with these films at a constant gate voltage. The mobilities of the anthradithiophene semiconductor films were calculated using the equation:

$$I_{DS} = (WC_i/2L)\mu(V_G - V_O)^2$$

where $C_i$, the insulator capacitance, is 10 nF/cm², $V_G$ is the gate voltage, $I_{DS}$ is the source drain current, $\mu$ is the mobility, and $V_O$ is the extrapolated threshold voltage. The calculation of carrier mobilities for semiconductor materials is described in Sze, S. M., *Semiconductor Devices Physics and Technology*, pp. 30–35, 200–207 (1985).

The temperature at which the anthradithiophene films were deposited on the substrate affected the mobility of the films. Thin film devices were prepared by depositing the organic semiconductor films at room temperature, 60° C., 70° C., 85° C., and 100° C. About ten devices were prepared at each deposition temperature. Table 1 below reports the average mobility of the films deposited at the various temperatures.

TABLE 1

| TEMPERATURE (°C.) | MOBILITY (cm²/Vs) |
|---|---|
| room temperature | 0.02 |
| 60 | 0.04 |
| 70 | 0.045 |
| 85 | 0.09 |
| 100 | not measurable |

The devices that were measured in order to obtain the data reported in Table 1 had the configuration depicted in FIG. 1a. The devices that were prepared using a deposition temperature of 100° C. did not have a continuous semiconductor film. Since the films were non-continuous, they did not conduct current. Consequently, the mobility of the device could not be measured. Table 1 illustrates that the temperature of the substrate during film deposition affects the mobility of the film. The maximum mobility was measured when the substrate temperature was 85° C.

The mobilities of films of the dialkylanthradithiophene materials described in Examples 2a–2c were also measured. The measured mobilities are reported in Table 2 below. The measured mobilities were for devices with the configuration depicted in FIG. 1b. The contacts had a ratio of width to length of about 1.5/1. Devices having contacts with a width to length ratio of 4/1 and dialkylanthradithiophene semiconductor films were also made. However, the films of devices with the 4/1 contact ratios had measured mobilities that were about thirty percent lower than the mobilities of the films reported in Table 2. This observation is attributed to the fact that more heat is produced when depositing the larger contacts (the contacts with the 4/1 ratio) than the smaller contacts (the contacts with the 1.5/1 ratio) and the greater heat reduced the mobility of the semiconductor films in contact therewith.

TABLE 2

| Material | Temperature (° C.) | Repeat Spacing (nm) | Mobility (cm²/Vs) |
|---|---|---|---|
| Example 2a | RT | 2.55 | 0.11 ± 0.01 |
|  | 85 | 2.6 | 0.15 ± 0.02 |
|  | 125 | 2.62 | 0.12 ± 0.02 |
| Example 2b | RT | 3.83 | 0.12 ± 0.02 |
|  | 85 | not resolvable | 0.14 ± 0.02 |
|  | 125 | 3.68 | 0.04 ± 0.01 |
| Example 2c | RT | not resolvable | 0.06 ± 0.01 |
|  | 85 | not resolvable | 0.06 ± 0.01 |
|  | 125 | 4.64 | 0.04 ± 0.001 |

Table 2 illustrates that mobilities of these materials are quite high, especially when the temperature of the substrate was 85° C. during deposition of the semiconductor film thereon.

Although applicants do not wish to be held to a particular theory, applicants believe that the temperature of the substrate during film formation effects film morphology, and that film morphology is related to the mobility of the film. Specifically, for a given material, the films that combine high crystallinity and good connectivity between crystal grains also have the highest mobilities. In support of this theory, table 2 reports the repeat spacing (i.e. the molecular repeat in a direction perpendicular to the substrate) of the various films described therein. The film morphology that correlates to a higher film mobility is when the majority of the molecules in the film are oriented with their plane of pi-conjugation perpendicular to the substrate on which the film is formed. In this orientation the repeat spacing is similar to the length of the longest axis of the molecule. Consequently, the pi-systems of the molecules overlap in a plane parallel to the substrate. In a thin film transistor, current must flow parallel to the substrate. Thus, the overlap occurs in the useful direction (i.e. the direction for current flow).

The dihexylanthradithiophene films formed at all three temperatures had a measured repeat spacings which were close to the theoretical value of 2.6 nm at an angle perpendicular to the substrate. This indicates that the molecules in the films were close to the desired orientation (i.e. their plane of pi-overlap was parallel to the substrate). With regard to example 2b, the mobility of the film formed at room temperature was higher than the mobility of the film formed at 125° C. The repeat spacing of the film formed at room temperature is closer to the theoretical spacing for the desired morphology than the repeat spacing of the film formed at 125° C. From this, applicants conclude that film morphology affects the mobility of the film.

EXAMPLE 4

Devices were prepared in the manner described in Example 3, except that the dialkylanthradithiophene (dihexylanthradithiophene) was formed on the substrate from solution. Dilute solutions of dihexylanthradithiophene (about 0.2 to about 1 percent) in hot (i.e. above about 100° C.) chlorobenzene were prepared and cast over a substrate with contacts previously formed thereon to obtain a device with the configuration illustrated in FIG. 1a. The solutions were evaporated in a vaccum oven at room temperature and elevated temperatures of 50° C., 70° C., 100° C., 150° C., and 180° C. Field effect activity was only observed for those devices in which the films were evaporated at 70° C. and 100° C. Films formed at the other temperatures were not continuous and therefore did not conduct current. Therefore, field effect activity for the films formed at these temperatures was not observed. The field effect mobilities of the devices with films evaporated at 700C were calculated to be 0.0006 cm$^2$/Vs and 0.003 cm$^2$/Vs. The field effect mobilities of the devices with films evaporated at 100° C. were calculated to be in the range of about 0.01 to about 0.02 cm$^2$/Vs.

What is claimed is:

1. A thin film transistor comprising:
a substrate with a layer of an organic semiconductor compound formed thereon and contacts for applying current through the layer of the organic semiconductor compound wherein the organic semiconductor compound has the structure:

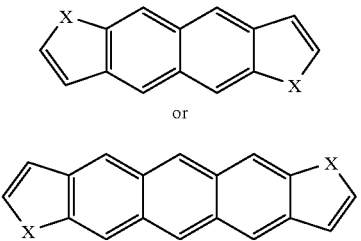

or an isomer thereof and is either substituted or unsubstituted, wherein X is either oxygen, amine, or sulfur and wherein the compound has a field-effect mobility greater than about 10$^{-3}$ cm$^2$/Vs and a conductivity of less than about 10$^{-6}$ S/cm at 20° C. and wherein the thin film transistor has an on/off ratio of the source drain current that is at least about 100.

2. The thin film transistor of claim 1 wherein the substituents are selected from the groups consisting of alkyl and alkoxyalkyl substituents with about two to about eighteen carbon atoms.

3. The thin film transistor of claim 2 wherein the substituents have about 4 to about 12 carbon atoms.

4. The thin film transistor of claim 2 wherein the substituted organic semiconductor compound is a substituted anthradithiophene with the following structure

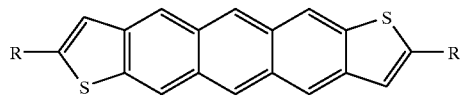

and isomers thereof wherein the substituent groups are designated by R.

5. The thin film transistor of claim 4 wherein the thin film transistor is a MIS-FET.

6. A process for fabricating a thin film transistor comprising:

dissolving an organic semiconductor compound in a polarizable organic solvent therefore to form an organic semiconductor compound solution in which the concentration of the organic semiconductor compound in the solution is about one percent or less by weight and wherein the organic semiconductor compound has the structure:

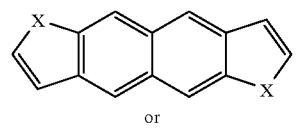

or

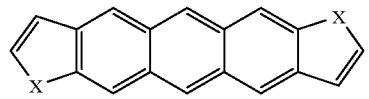

or an isomer thereof and is either substituted or unsubstituted, and wherein X is either oxygen, amine, or sulfur;

depositing the organic compound solution over a dielectric layer formed on a substrate;

evaporating the solvent from the organic semiconductor solution, thereby forming a layer of organic semiconductor over the dielectric layer;

and forming contacts on the substrate for applying current through the organic semiconductor layer.

7. The process of claim 6 wherein the polarizable solvent is an aromatic, polarizable solvent.

8. The process of claim 7 wherein the polarizable solvent is selected from the group consisting of chlorobenzene, dichlorobenzene, and xylene.

9. The process of claim 6 wherein the substituents are selected from the groups consisting of alkyl and alkoxyalkyl substituents with about two to about eighteen carbon atoms.

10. The process of claim 9 wherein the substituents have about 4 to about 12 carbon atoms.

* * * * *